(12) United States Patent
Akaike et al.

(10) Patent No.: US 6,924,513 B2
(45) Date of Patent: Aug. 2, 2005

(54) LIGHT EMITTING ELEMENT AND MANUFACTURING METHOD FOR THE SAME

(75) Inventors: Yasuhiko Akaike, Kawasaki (JP); Shoichi Washizuka, Yokohama (JP); Yoshiyuki Kinugawa, Soka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 93 days.

(21) Appl. No.: 10/352,126

(22) Filed: Jan. 28, 2003

(65) Prior Publication Data

US 2004/0026700 A1 Feb. 12, 2004

(30) Foreign Application Priority Data

Jan. 29, 2002 (JP) ..................................... P2002-020185
Jan. 24, 2003 (JP) ..................................... P2003-016275

(51) Int. Cl.$^7$ .............................................. H01L 29/22
(52) U.S. Cl. .......................................... 257/98; 257/100
(58) Field of Search .............................. 257/98, 100, 95

(56) References Cited

U.S. PATENT DOCUMENTS 6,087,680 A * 7/2000 Gramann et al. .............. 257/91
6,531,405 B1 * 3/2003 Wegleiter et al. ............ 438/745

FOREIGN PATENT DOCUMENTS

| JP | 2000-196141 | 7/2000 |
| JP | 2000-299494 | 10/2000 |
| JP | 2001-068743 | 3/2001 |

* cited by examiner

*Primary Examiner*—Sara Crane
(74) *Attorney, Agent, or Firm*—Oblon, Spivak, McClelland, Maier & Neustadt, P.C.

(57) ABSTRACT

A light emitting element includes: a light emitting layer; a rectangular first principal surface being parallel to the light emitting layer; a rectangular second principal surface opposing to the first principal surface so that the light emitting layer is sandwiched between the first and second principal surfaces; and first through fourth side surfaces of the light emitting element provided with a rough surface, the first through fourth side surfaces connecting between the first principal surface and the second principal surface, respectively so as to define a solid shape.

10 Claims, 15 Drawing Sheets

LIGHT EMITTING ELEMENT AND MANUFACTURING METHOD FOR THE SAME

CROSS REFERENCE TO RELATED APPLICATIONS

This application is based upon and claims the benefit of priority from prior Japanese Patent Application P2002-20185 filed on Jan. 29, 2002 and Japanese Patent Application P2003-16275 filed on Jan. 24, 2003; the entire contents of which are incorporated by reference herein.

BACKGROUND OF THE INVENTION

1. Field of the Invention

The present invention relates to a light emitting element having a high level of brightness and a manufacturing method for the same.

2. Description of the Related Art

An optical power output of a semiconductor light emitting element (LED) is determined by a product of an internal quantum efficiency representing a conversion efficiency of an injection current to photons, and an extraction efficiency for the photons emitted from the semiconductor passing through a molded resin or air. In order to improve the extraction efficiency and increase the optical power output of the LED, many methods have been proposed, such as tilted side surfaces, roughened side and top surfaces, microlenses, anti-reflection films and the like.

A basic idea for improving the extraction efficiency can be described as follows. The photon extraction efficiency depends on a difference in the refractive index of a semiconductor layer and a surrounding medium. For example, when a periphery of the semiconductor layer is encapsuled with an epoxy resin, the photons with an incident angle less than 27 degrees regarding to the normal of a surface of the semiconductor layer may be extracted from the surface. In the case of commercial LEDs, an optical design is adopted so that the photons with the incident angle of 27 degrees or greater are reflected at an interface between the semiconductor layer and the epoxy resin. Generally, the reflected photons may disappear by being absorbed in the semiconductor layer, or as a result of multiple reflections, only a portion of the reflected photons may be extracted. Accordingly, the extraction efficiency for the LED chip encapsuled with the epoxy resin may become poor.

A method to increase the extraction efficiency may be provided by using the tilted side surfaces so as to reduce the incident angle of the photons emitted from a light emitting layer of the LED to the interface between the semiconductor layer and the surrounding medium. Alternatively, by using a method for roughening the surfaces of the semiconductor layer so as to bring about a random angular distribution for the interface between the semiconductor layer and the surrounding medium, the photons can be extracted more efficiently using a light scattering effect.

For example, with regard to the tilted side surfaces, in Japanese Patent Applications Laid-open Nos. Hei 10-341085 and 2001-68743, the extraction efficiency is improved by fabricating an LED chip with a trapezoidal shape. In addition, similar proposals regarding the roughened side and top surfaces are disclosed in, for example, Japanese Patent Applications Laid-open Nos. 2000-196141, Hei 10-200162 and 2000-299494. Furthermore, an example of an actual method in making an LED has been given using an electron beam lithography to form the top surface of a GaAlAs LED into a conical shape (refer to M. Ishimori, et al., "Extended Abstracts of The $48^{th}$ Spring meeting, 31a-ZW-10", The Japan Society of Applied Physics and Related Societies, 2002, p. 997).

In addition, the extraction efficiency may be improved by using a graded index layer formed on the surfaces of the semiconductor layer, that continuously changes the refractive index from the semiconductor layer to the surrounding medium to prevent optical refraction. In fact, it is difficult to form such a layer having the continuously changing refractive index on the surfaces of the LED. Nevertheless, it is possible to improve the extraction efficiency using the graded index layer by roughening the surfaces of the LED to form small irregularities approximately equal to or smaller than the emitted wavelength.

As described above, by tilting and roughening the side surfaces of the LED it is possible to improve the extraction efficiency, however the following new problems arise (1) When the tilted side surfaces of a GaP substrate having a crystal orientation correspond or close to a (100) plane, are roughened, due to a relationship with the crystal orientation, only two of the four side surfaces are capable of being roughened and obviously the improvement in the extraction efficiency is less than with all four side surfaces being roughened. Therefore it is difficult to say that an inherent property of the internal quantum efficiency of the light emitting layer is sufficiently exhibited.

(2) Reliability for the LED chip may be decreased due to a nonuniform stress of the molded resin. In other words, in a trapezoidal LED chip with the tilted side surfaces molded with a resin such as an epoxy, when a top surface electrode is formed having a larger surface area than a bottom surface electrode, an upward force is applied to the LED chip from the resin. In the opposite case, where the top surface electrode is smaller than the bottom surface electrode, a downward force is applied. Such nonuniform stress exerted on the LED chip causes strain and cracks, as well as a remarkable loss in the long-term reliability of the LED chip. In addition, excessive stress on the LED chip causes peeling and breakage of the LED chip. While in rectangular solid LED chips the stresses with the molded resin are balanced out by canceling the stresses applied to opposite side surfaces, since shape symmetry cannot be assured, the stresses generated with the molded resin are extremely difficult to thoroughly eliminate in a trapezoidal LED chip.

SUMMARY OF THE INVENTION

A first aspect of the present invention inheres in a light emitting element, and includes: a light emitting layer; a rectangular first principal surface being parallel to the light emitting layer; a rectangular second principal surface opposing to the first principal surface so that the light emitting layer is sandwiched between the first and second principal surfaces; and first through fourth side surfaces of the light emitting element provided with a rough surface, the first through fourth side surfaces connecting between the first principal surface and the second principal surface, respectively so as to define a solid shape.

A second aspect of the present invention inheres in a manufacturing method for a light emitting element, and includes: forming first cuts in a first direction using a V-shaped blade on a first principal surface of a semiconductor substrate having a light emitting layer; forming second cuts in a second direction perpendicular to the first direction facing the first principal surface using the V-shaped blade on a second principal surface of the semiconductor substrate having the light emitting layer; separating the semiconductor substrate into chips along the first and second cuts; and forming rough surfaces on side surfaces of the first and second cuts by a wet etching process.

A third aspect of the present invention inheres in a light emitting element, and includes: separating a semiconductor substrate having a light emitting layer into chips; and forming rough surfaces on all of side surfaces of the chips by wet etching using hydrofluoric acid.

DETAILED DESCRIPTION OF THE INVENTION

Figure 1:
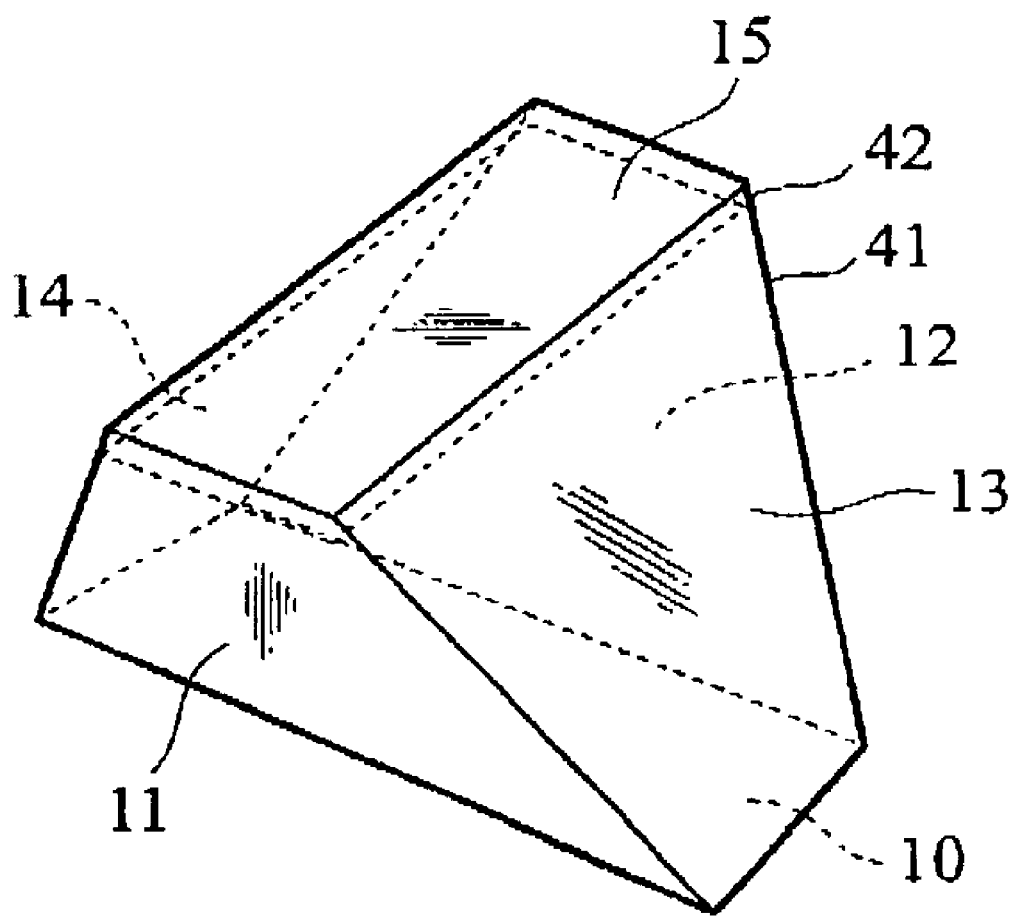
FIG. 1 is an oblique perspective view showing the structure of an LED chip according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 2A:
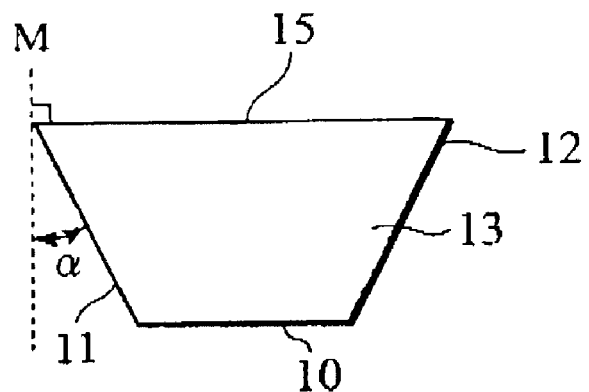
FIGS. 2A through 2C are side and top views of the LED chip shown in FIG. 1.
Figure 2B:
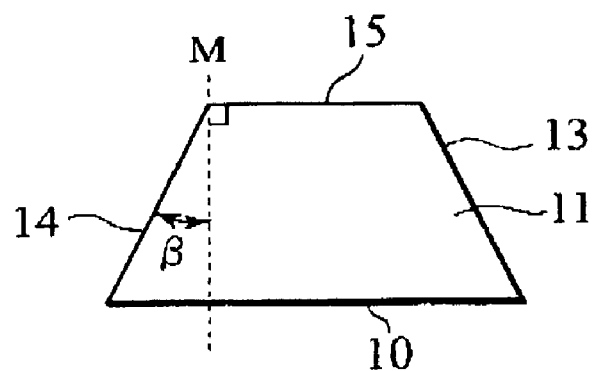
Figure 2C:
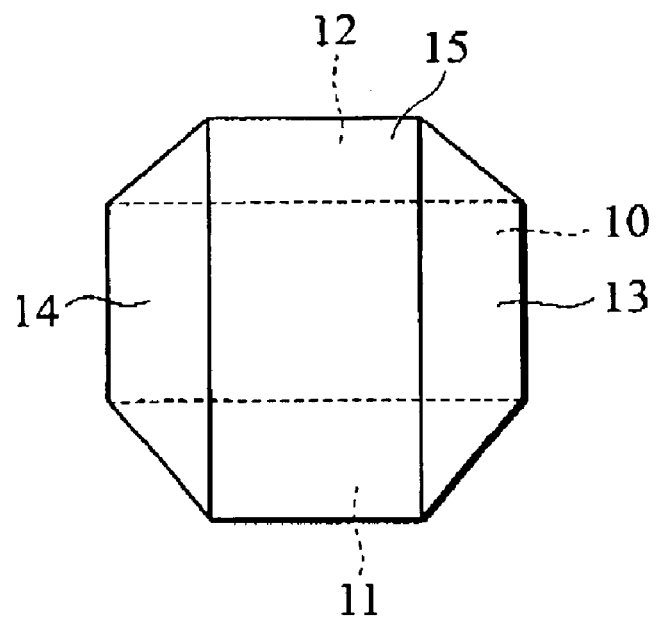

A light emitting element chip (LED chip) according to a first embodiment of the present invention, as shown in FIG. 1 as an oblique perspective view, FIGS. 2A and 2B as side views, and FIG. 2C as a top view, has a hexahedron shape. The LED chip is fabricated, for example, from an LED wafer (semiconductor substrate) with a thickness of about 150 $\mu$m, by using GaP for a base substrate 41 and InGaAlP for a light emitting layer 42. The hexahedral LED chip includes a rectangular top surface (first principal surface) 15 having, e.g. a long edge of 300 $\mu$m and a short edge of 160 $\mu$m, a rectangular bottom surface (second principal surface) 10 having, e.g. a long edge of 300 $\mu$m and a short edge of 160 $\mu$m, and first through fourth side surfaces 11, 12, 13, and 14. The long edges of the top and bottom surfaces are arranged orthogonal to each other. In addition, the first and second side surfaces 11 and 12 facing to each other are formed by trapezoids having the same shape and dimensions and the third and fourth side surfaces 13 and 14 facing to each other are formed by inversed trapezoids that are substantially equal to the trapezoids of the first and second side surfaces 11 and 12, rotated 180 degrees.

More specifically, the two short edges of the rectangular top surface 15 define the top edges of the trapezoidal first and second side surfaces 11 and 12, and the long edges of the rectangular bottom surface 10 define the bottom edges of the trapezoidal first and second side surfaces 11 and 12. In addition, the two long edges of the rectangular top surface 15 define the bottom edges of the inversed-trapezoidal third and fourth side surfaces 13 and 14, and the short edges of the rectangular bottom surface 10 define the top edges of the inversed-trapezoidal third and fourth side surfaces 13 and 14. Accordingly, as shown in FIG. 2A, the first and second side surfaces 11 and 12 of the LED chip are structured to have a tilt angle $\alpha$ of, for example, 30 degrees with respect to a normal line M of the top surface 15, and as shown in FIG. 2B, the third and fourth side surfaces 13 and 14 are structured to have a tilt angle $\beta$ of, for example, 30 degrees with respect to the normal line M of the top surface 15. In other words, the side surfaces of the chip are constructed with the first and second side surfaces 11 and 12 facing to each other having the tilt angles (90−$\alpha$) degrees with the top surface 15, and the third and fourth side surfaces 13 and 14 facing to each other, having the tilt angles (90−$\beta$) degrees with the bottom surface 10 of substantially equal sizes as compared to the first and second side surfaces 11 and 12. It should be noted that, in the first embodiment of the present invention, the tilt angles $\alpha$ and $\beta$ of the side surfaces of the LED chip are set to 30 degrees, however, the tilt angles $\alpha$ and $\beta$ may be set in a range between about 20 and 40 degrees.

In addition, the crystal orientations for each of the surfaces is identified as follows, the bottom surface 10 is a ($\overline{1}$00) plane, the first side surface 11 is a ($\overline{111}$)P plane, the second side surface 12 is a ($\overline{1}$11)P plane, the third side surface 13 is a (11$\overline{1}$)P plane, the fourth side surface 14 is a (1$\overline{1}$1)P plane, and the top surface 15 of the InGaAlP light emitting layer is a (100) plane. Thus, all of the side surfaces 11 through 14 are constructed on designed with planes having the crystal orientations correspond or close to the {111}P planes. Accordingly, each of the side surfaces 11 through 14 can be provided to exhibit a bumpy surface (hereinafter, also referred to as "a rough surface") with an interval between adjoining projecting points of the rough surface (hereinafter, also referred to as "a surface roughness interval") of, for example, approximately 1 $\mu$m. In the first embodiment of the present invention, the surface roughness interval is given as approximately 1 $\mu$m, however, within a range of about 0.5 and 5 $\mu$m, similar effects may be achieved.

While in an earlier method, only two side surfaces at most could be applied the rough surface, it is possible to rough surface all four side surfaces correspond or close to the {111}P planes with the LED chip of the first embodiment of the present invention. Then, it becomes possible to drastically improve the extraction efficiency. Moreover, since the LED chip has a laterally and vertically symmetric shape, resin mold stress may be applied evenly throughout the LED chip, and as a result, reliability of the LED chip may be improved.

A manufacturing method for the LED chip with the shape described above (hereafter referred to as a modified pyramid) is described forthwith while referencing FIGS. 3A through 3D and FIGS. 4A through 4C.

Figure 3A:
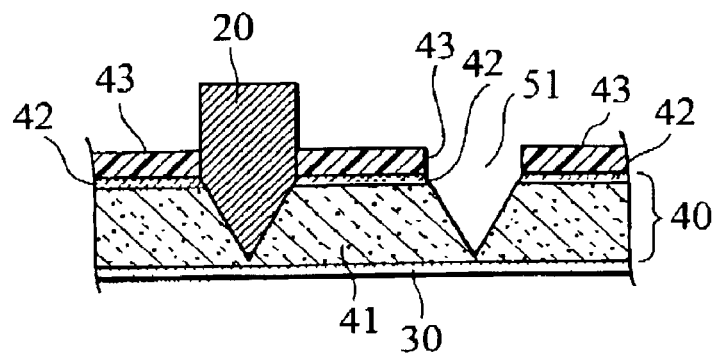
FIGS. 3A through 3D are process diagrams showing a method for manufacturing the LED chip according to the first embodiment of the present invention.

(a) To begin with, as shown in FIG. 3A, an LED wafer (semiconductor substrate, see FIG. 4A) 40 of about 150 $\mu$m thickness is prepared having a InGaAlP layer as a light emitting layer 42 on a GaP substrate as a base substrate 41. A resist layer 43 is coated on a top surface of the LED wafer 40. In addition, since the same basic process is employed regardless of the type of the base substrate 41, as long as the base substrate 41 is substantially transparent for a wavelength of an emitted light, the light emitting layer 42 for various types of LED chips including InGaN, GaAs, GaAlAs, and GaAsP may naturally be applicable.

Figure 4A:
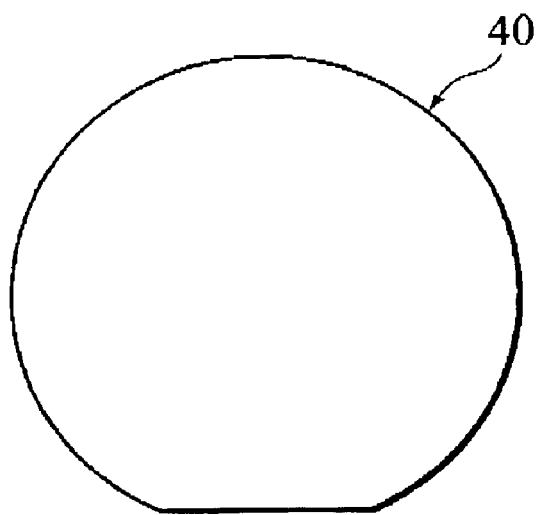
FIGS. 4A through 4C are diagrams showing different appearances of the wafer during manufacturing process of the LED chip according to the first embodiment of the present invention.
Figure 4B:
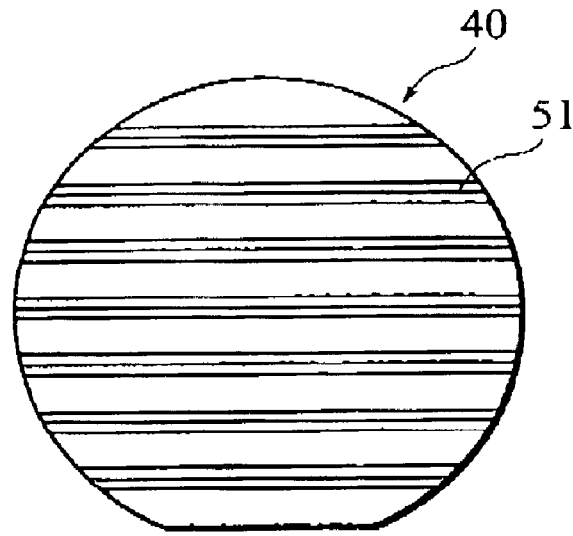
Figure 4C:
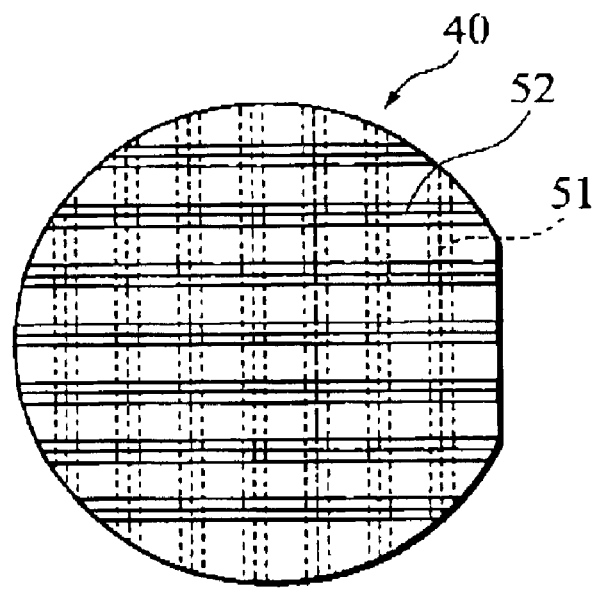

(b) As shown in FIG. 3A, a blade 20 with a V-shaped edge having a point angle of 60 degrees is used for the LED wafer 40 affixed upon a dicing sheet 30 to perform cutting in a single direction and form first cuts 51 (see FIG. 4B). When performing cutting, the depth of the first cuts 51 is set so that the LED wafer 40 is not completely severed. Namely, the first cuts 51 are made with a pitch of about 300 $\mu$m and a depth of about 120 $\mu$m from the top surface of the LED wafer 40. As stated, the point angle of the blade 20 is 60 degrees, so as to provide a tilt angle of 30 degrees to side surfaces in the first cuts 51.

Figure 3B:
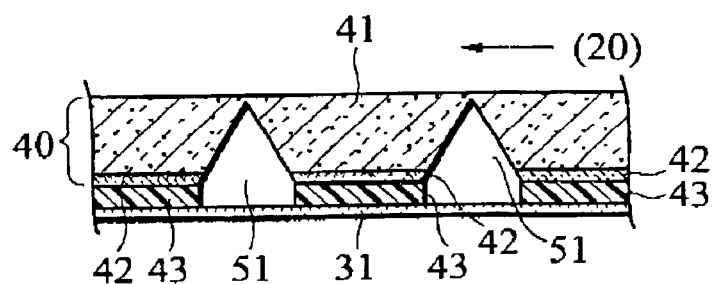
Figure 3C:
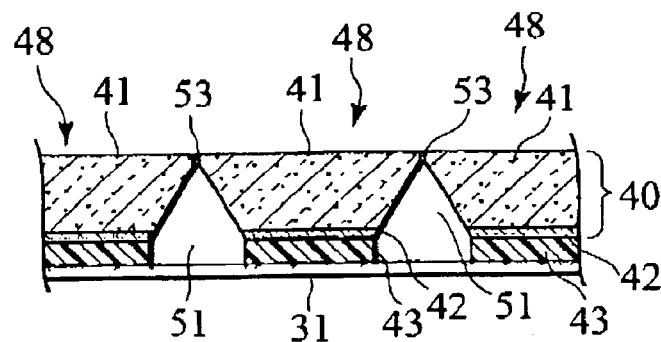

(c) The wafer 40 is separated from the dicing sheet 30, and as shown in FIG. 3B, turned upside-down and re-fixed on a dicing sheet 31. Since the depth of the first cuts 51 is set so that the LED wafer 40 is not subjected to a full cutting and not separated with the first dicing, separation from the dicing sheet and subsequent reapplication may be performed with ease. Once the LED wafer 40 is fixed on the dicing sheet 31, cutting is performed on the bottom surface in a direction orthogonal to the first cuts 51 in the top surface (see FIG. 4C) to form second cuts 52 with a pitch of about 300 $\mu$m with the full cutting.

As with the above, for the LED wafer with the thickness of 150 $\mu$m, the dicing with a pitch of about 300 $\mu$m is performed on the top surface by the first cuts 51 in a depth of about 120 $\mu$m, and then on the bottom surface by the second cuts 52 which are full cuts using the blade 20 with the point angle of 60 degrees. With the dicing conditions, rectangular shapes are formed in the top surface with long edges of about 300 $\mu$m and short edges of about 160 $\mu$m, and in the bottom surface with long edges of about 300 $\mu$m and short edges of about 126 $\mu$m.

It should be noted that the various dimensions and shapes of a modified pyramid chip may be formed by setting the thickness of the LED wafer 40, the point angle of the blade 20, the dicing pitch and the thickness of the uncut part. For example, the blade 20 having the point angle of 60 degrees is used for cutting, however, the point angle may be in a range of between about 40 and 80 degrees providing a tilt angle in a range of between about 20 and 40 degrees, is also permissible. In addition, it should be noted that the cutting of the bottom surface may be either a full cut or semi-full cut when the LED chips can be reliably separated from each other by using a breaking method following the dicing process.

Figure 3D:
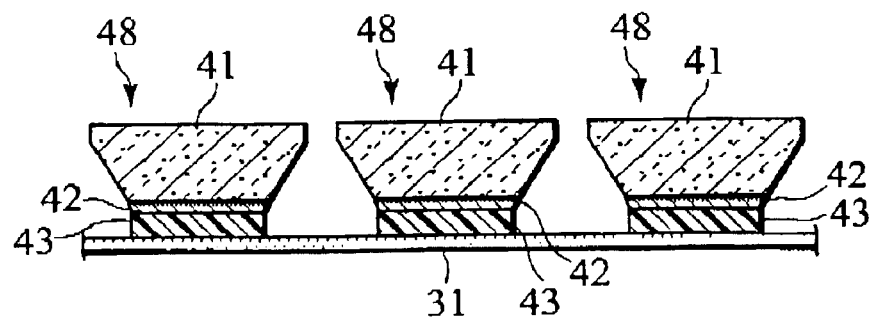
Figure 5A:
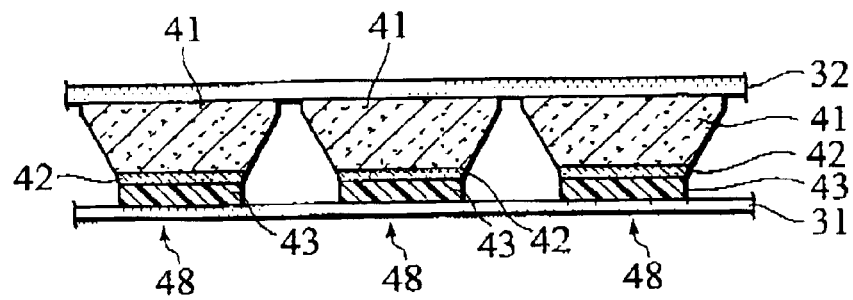
FIGS. 5A through 5F are process diagrams showing a rough surface processing method for the LED chip according to the first embodiment of the present invention.
Figure 5B:
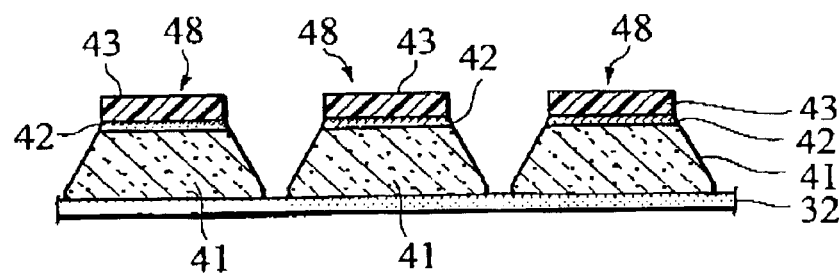
Figure 5C:
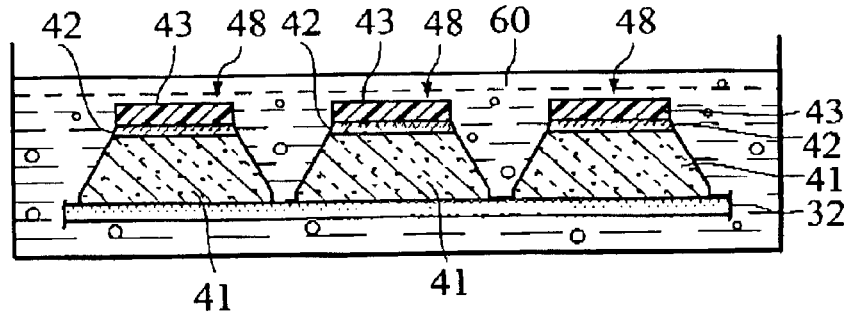

(d) After carrying out the dicing as described above, breaking is performed using a roller, as shown in FIG. 5C, so as to generate cracks 53 to divide the LED chips 48 along the first and second cuts. Then, the dicing sheet 31, which is a plastic film is expanded to separate, as shown in FIG. 3D, the LED chips 48 individually on the dicing sheet 31 with the resist layer 43 therebetween. The LED chips 48 are formed with a modified pyramid shape constructed with side surfaces having the crystal orientations correspond or close to the {111}P planes.

Next, a method for providing a rough surface the side surfaces of the modified pyramid LED chips 48 obtained as described above is described with referencing FIGS. 5A through 5F. By providing the rough surface the side surfaces of the LED chip with intervals that are corresponding approximately to the emitted wavelength, the rough surface can be considered to have an average effective refractive index between the semiconductor and vacuum. Accordingly, an anti-reflection film may be provided which has a theoretically continuous refractive index, and significant improvement in brightness for the LED chip 48 may be expected. In the first embodiment of the present invention, the rough surface processing is performed using a wet etching method, which is capable of achieving lower cost rough surface processing compared to processes such as an electron beam (EB) lithography or reactive ion etching (RIE).

(a) To begin with, while in the state where the modified pyramid LED chips 48 are attached to the dicing sheet 31 as shown in FIG. 3D, an acid resistant sheet 32 is applied opposite the dicing sheet 31, as shown in FIG. 5A, sandwiching the modified pyramid LED chips 48 between the dicing sheet 31 and the acid resistant sheet 32.

Figure 5D:
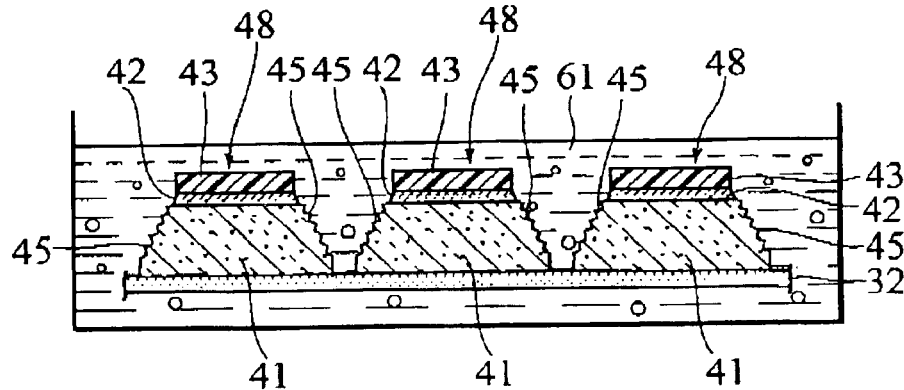

(b) Then, as shown in FIG. 5B, after turning the modified pyramid LED chips 48 upside down and removing the dicing sheet 31, the modified pyramid LED chips 48 on the acid resistant sheet 32 are, as shown in FIG. 5C, immersed in a hydrochloric acid (HCl)-hydrogen peroxide ($H_2O_2$) mixed solution 60 for removing damaged layers on the side surfaces of the modified pyramid LED chips 48, which may be induced by the dicing and smoothing process for the side surfaces, (c) After rinsing with water, as shown in FIG. 5D, the modified pyramid LED chips 48 are immersed in an HCl solution 61 and so that all four of the side surfaces are etched by the HCl solution 61 at 60° C. for 10 minutes. A rough surface 45 is formed on all four of the side surfaces.

Figure 5E:
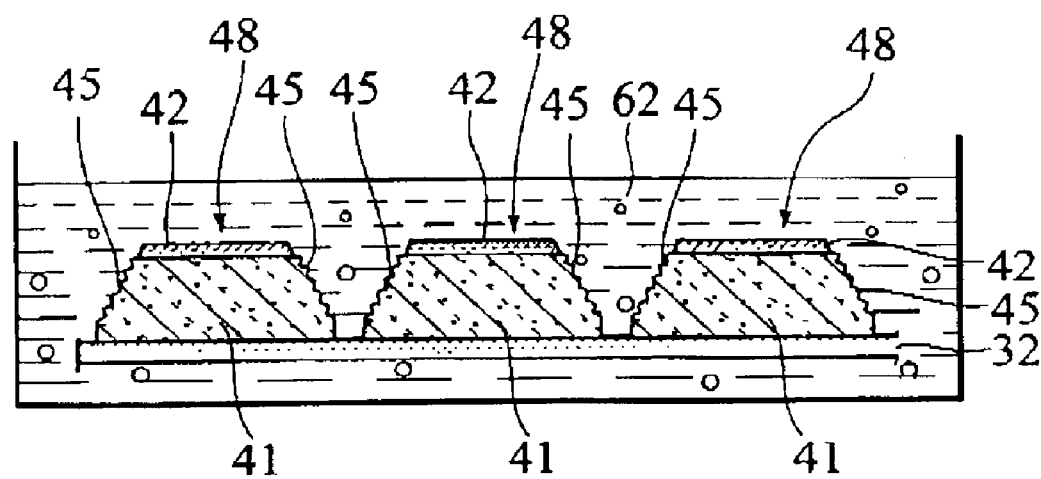
Figure 5F:
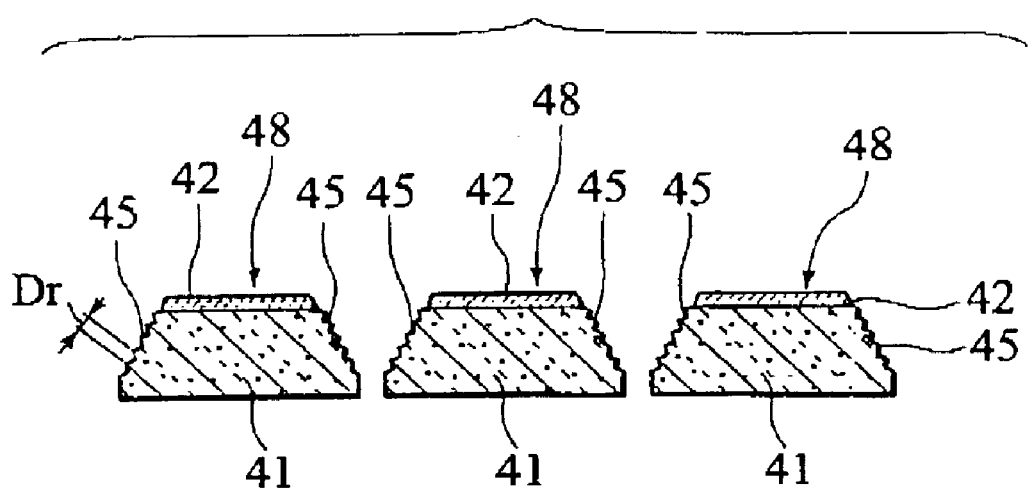

(d) After rinsing with water the set of chips, which have been rough surface processed, the resist layer 43 is removed by immersion in a developer 62 as shown in FIG. 5E. Then, by rinsing with water and drying, the modified pyramid LED chips 48 providing a rough surface all of the side surfaces as shown in FIG. 5F are achieved.

The rough surface 45 formed on the side surface can be observed with a scanning electron microscope (SEM) monitor, and a surface roughness interval Dr is in a range of between approximately 0.1 and 1 $\mu$m, which is approximately equal to or less than the wavelength of visible light. As mentioned above, the surface roughness interval Dr is defined as an interval between adjoining projecting points of the rough surface, It should be noted that, in the first embodiment of the present invention, during the above rough surface processing, in order to protect the light emitting layer 42 from the wet etching, the light emitting layer 42 is prepared with the resist layer 43 for protection before dicing, however, if the light emitting layer 42 is of a material sufficiently tolerant to the HCl solution 61 then it is not necessary to provide the resist layer 43 to protect the light emitting layer 42, In order to implement the rough surface processing on the LED chip 48 having an InGaAlP light emitting layer 42 using the GaP substrate as the base substrate 41, it is necessary to consider anisotropic etching characteristics specific to a GaP crystal. The surface of a commonly used GaP substrate is either a (100) plane or a plane slightly tilted from the (100) plane.

Figure 6:
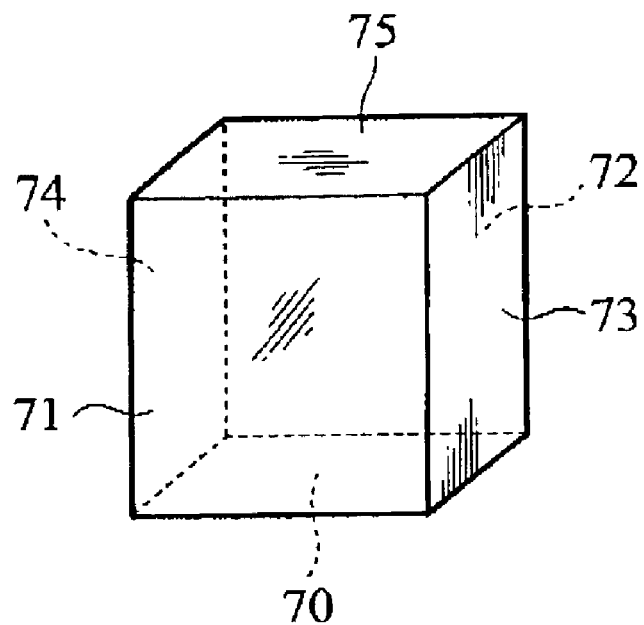
FIG. 6 is a schematic diagram of a rectangular solid LED chip.

When applying rough surface to the GaP substrate with the wet etching process using the HCl solution 61, the rough surface processing proceeds mostly in the {111}P plane, and it is impossible to apply the rough surface to the (100) plane, the (110) plane, or a surface equivalent to the (100) and (110) planes. Accordingly, it is not possible to apply the rough surface to the side surfaces of an LED chip using a rectangular solid GaP substrate, as shown in FIG. 6, where the first and second side surfaces 71 and 72 are (011) and ($0\bar{1}\bar{1}$), the third and fourth side surfaces 73 and 74 are ($01\bar{1}$) and ($0\bar{1}1$), and the top and bottom surfaces 75 and 70 are (100) and ($\bar{1}00$).

However, if the side surfaces are cut with a tilt angle to give a {111}P plane, the rough surface may be applied to the side surfaces. For example, assuming that the top surface of the GaP substrate is a (100) plane, since an angle formed between a principal axis [100] and a principal axis [111] is 54.7 degrees, the {111}P plane has an angle of 35.3 degrees relative to the top surface of the GaP substrate. In order to provide the {111}P plane for the side surfaces, dicing is performed with a blade having a point angle of 70.6 degrees which is twice that of the above-described 35.3 degree angle.

Figure 7:
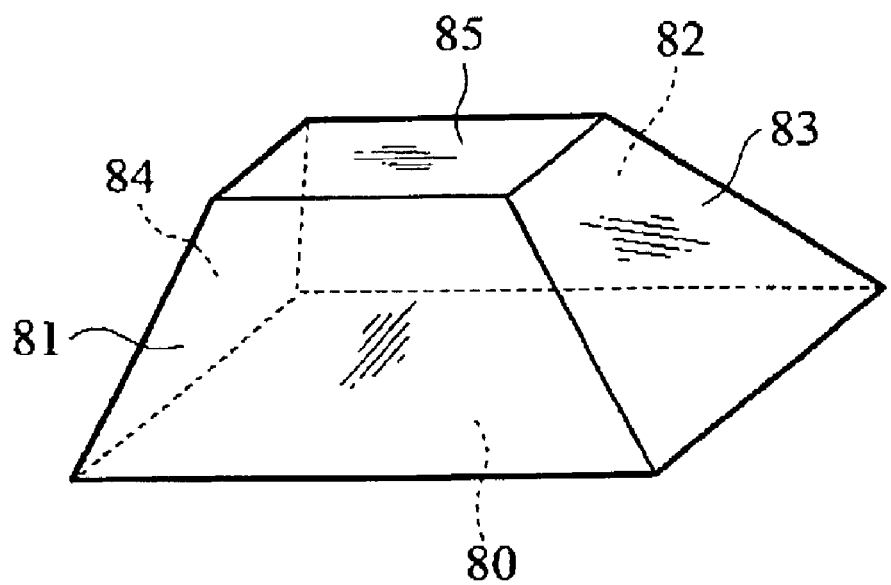
FIG. 7 is a schematic diagram of a truncated pyramid LED chip.

Actually, as shown in FIG. 7, in the case of a truncated pyramid LED chip where a GaP substrate having a top surface 85 as a (100) plane and a bottom surface 80 as a ($\bar{1}00$) plane is diced orthogonal to or parallel with the [$01\bar{1}$] direction using a blade with the point angle of about 70 degrees and the side surfaces 81 through 84 are subjected to the wet etching with the HCl solution 61, the rough surface may be applied to first and second side surfaces 81 and 82 having the ($11\bar{1}$) plane and ($1\bar{1}1$) plane where P atoms are exposed on the surfaces. However the rough surface may not be applied to third and fourth side surfaces 83 and 84 having the (111) plane and ($1\bar{1}\bar{1}$) plane where Ga atoms are exposed on the surfaces.

An LED lamp was fabricated with the truncated pyramid LED chip, and the brightness thereof was measured. The brightness is 1.5 times better than an LED lamp fabricated with the rectangular solid LED chip. In other words, brightness is 50% better when two of the four side surfaces are provided the rough surface. Accordingly, when the rough surface is applied to all four of the side surfaces, the brightness may be expected to be twice as large as the brightness of the rectangular solid LED chip.

The crystal plane to which the rough surface processing is applied is the {111}P, which may be any of the following four equivalent planes: ($\bar{1}11$), ($11\bar{1}$), ($1\bar{1}1$), and ($\bar{1}11$). In the first embodiment of the present invention, the shape of the LED chip having the four equivalent planes of {111}P as the side surfaces and the manufacturing method for achieving such a shape has been described above.

Figure 8:
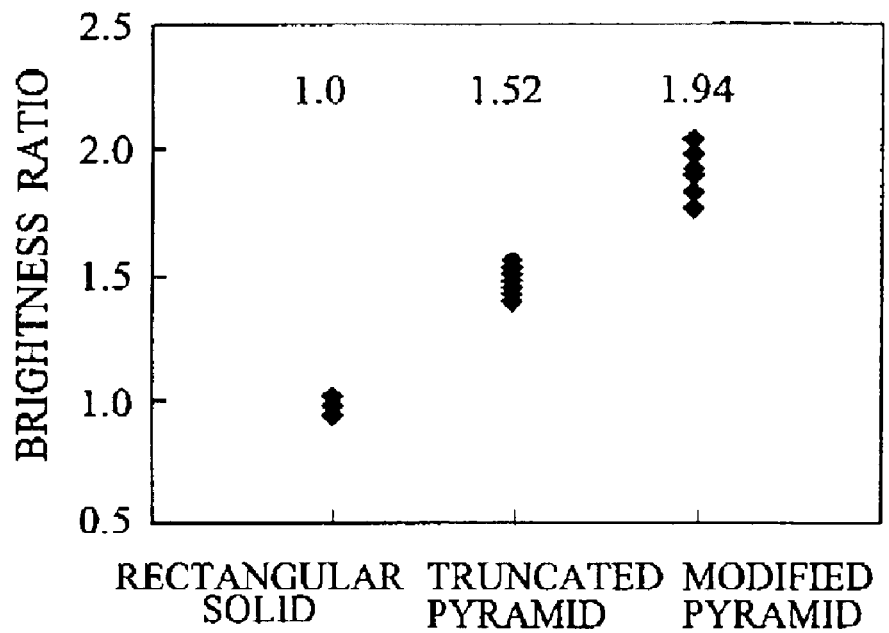
FIG. 8 is a graph showing brightness measurement results for the modified pyramid LED chips.

The results from measuring the brightness of the modified pyramid LED chip according to the first embodiment of the present invention are shown in FIG. 8.

In FIG. 8, for comparison, using a single LED wafer split into three parts, rectangular solid LED chips are formed from one part, truncated pyramid LED chips are formed from another part, and modified pyramid LED chips are formed from the rest of the LED wafer. Then, LED lamps are fabricated and the improved extraction efficiency results according to the LED chip shape are verified.

The brightness is measured from intensity of light coming from the LED chip using an integrating sphere, under a current of 20 mA to the LED chip. The rectangular solid LED chips are fabricated with a scribing method, and the truncated pyramid and modified pyramid chips are fabricated with a dicing method and then applied the rough surface using the HCl etching process. The thickness of the LED chips is 150 μm and a blade with a point angle of 70 degrees is used for dicing. Under the conditions described above, the truncated pyramid LED chip has two {111}P planes in the side surfaces, and the modified pyramid LED chip has four {111}P planes in the side surfaces. Ten samples were measured for each LED chips.

As clearly shown in FIG. 8, in comparison with the rectangular solid LED chips, the brightness of the truncated pyramid LED chips is approximately 1.5 times greater and the brightness of the modified pyramid LED chips is approximately 1.9 times greater. Accordingly, it may be concluded that, of the four side surfaces, having two side surfaces provided the rough surface improved brightness by 50%, and providing the rough surface the remaining two side surfaces further improved brightness by 40%.

Thus, by merely adding low cost processes such as dicing and wet etching to the manufacturing method for the LED chip, the modified pyramid LED according to the first embodiment of the present invention may achieve a brightness that is nearly double in comparison with the rectangular solid LED chip.

Figure 9:
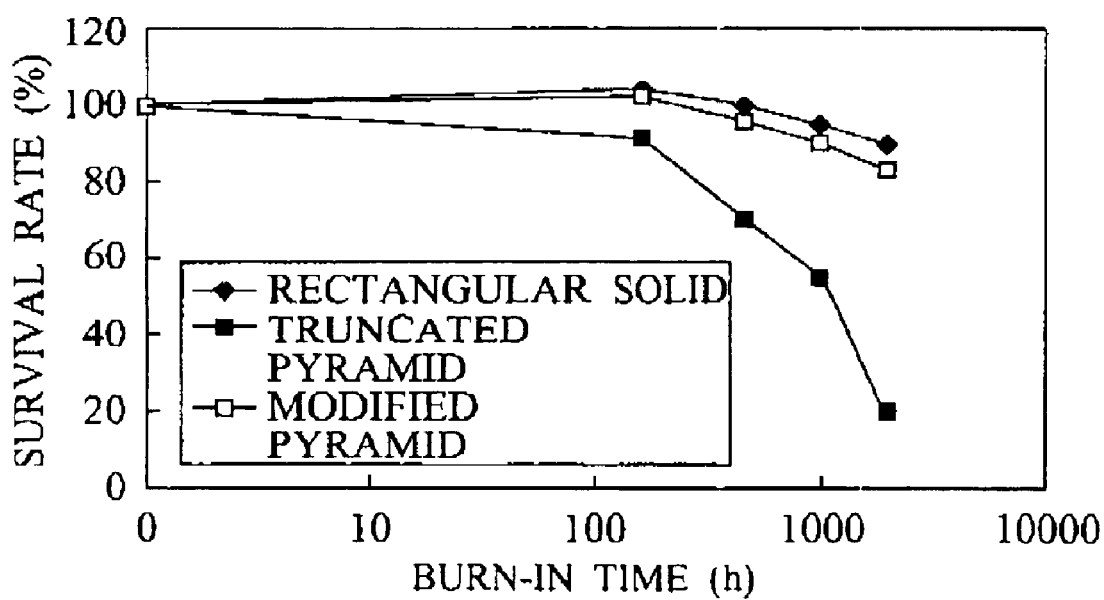
FIG. 9 is a graph showing reliability measurement results for the modified pyramid LED chips.

Next, results from measuring the reliability of the modified pyramid LED chip according to the first embodiment of the present invention are described in FIG. 9. With three types of resin molded LED lamps fabricated by the rectangular solid LED chips, the truncated pyramid LED chips, and the modified pyramid LED chips, accelerated burn-in tests under a current of 50 mA were performed at a temperature of −40° C. After a burn-in time of 10,000 hours, a survival rate with the rectangular solid LED lamps was 95%, the survival rate with the truncated pyramid LED lamps was 55%, and the survival rate with the modified pyramid LED lamps was 92%. Thus, the truncated pyramid LED lamps show a remarkably low survival rate. The cause of the low survival rate for the truncated pyramid LED lamps may be explained in the following manner.

A compression stress is applied to the LED chip at a low temperature from the molded resin of the LED lamp. While a uniform stress is applied to the side surfaces of the rectangular solid LED chip from the resin, with the truncated pyramid LED chip, stress is applied normal to the tilted side surfaces and therefore, causes an unbalanced stress induced in the upward direction of the LED chip. Because of the energy of the burn-in current with the unbalanced stress, it is considered that with the truncated pyramid LED chip, penetrating dislocations extend to the light emitting layer so as to decrease the light emitting efficiency.

In addition, although the modified pyramid LED chip has side surfaces that are tilted similar to the truncated pyramid LED chip, the two sets of the opposed side surfaces that are tilted in different directions cancel out the stress of each other so that the unbalanced stress as in the truncated pyramid LED chip is not induced. Namely, in the case of the rectangular solid LED chip and the modified pyramid LED chip where a symmetrical shape is maintained, since the stress applied to the LED chip is canceled out across the entire LED chip, few dislocations in the LED chip may be induced due to the stress, and a long term reliability may result. Conversely, since linear symmetry is upset and the stress is concentrated in one portion of the truncated pyramid LED chip, many dislocations may be induced. Such dislocations decrease the brightness of the LED chip and reducing the long term reliability. Accordingly, the shape of the modified pyramid LED chip according to the first embodiment of the present invention may also be considered as being exceedingly advantageous in terms of reliability.

Thus, the modified pyramid LED chip according to the first embodiment of the present invention that achieves higher brightness and assures chip reliability may be fabricated by a low cost method such as dicing and wet etching.

Modified Example of the First Embodiment

In the first embodiment of the present invention, the method for manufacturing an LED chip with a modified pyramid shape shown in FIG. 1 includes, previously fabricating the modified pyramid LED chip configured with all of the side surfaces having crystal orientations correspond or close to the {111}P planes, and thereafter carrying out rough surface processing. A modified example of the first embodiment of the present invention differs in that the rough surface processing is implemented during fabrication of the modified pyramid shape, and as the rest is similar to the first embodiment repetitive descriptions will be omitted.

The method for manufacturing a modified pyramid LED according to the modified example of the first embodiment is described with referencing FIGS. 10A through 10J.

Figure 10A:
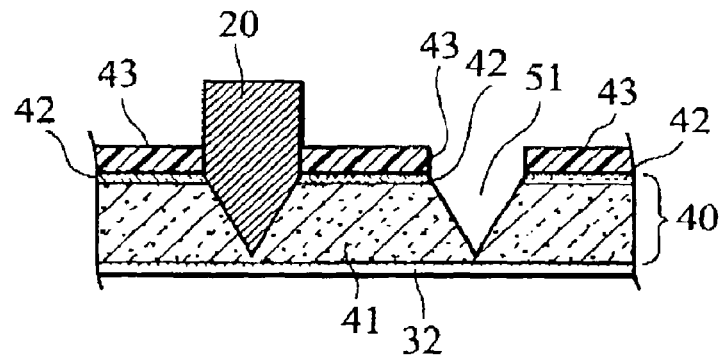
FIGS. 10A through 10J are process diagrams illustrating a method for manufacturing the LED chip according to a modified example of the first embodiment of the present invention.

(a) To begin with, as shown in FIG. 10A, a blade 20 with a V-shaped edge of a point angle of 60 degrees is used on a top surface of an LED wafer 40 affixed upon an acid resistant sheet 32 to perform cutting in one direction and form first cuts 51 (see FIG. 4B).

Figure 10B:
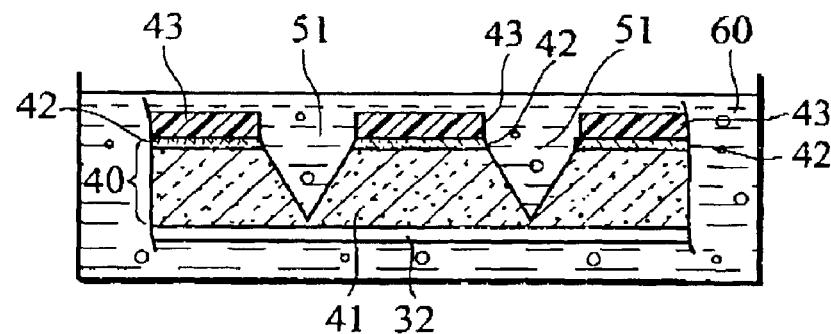
Figure 10C:
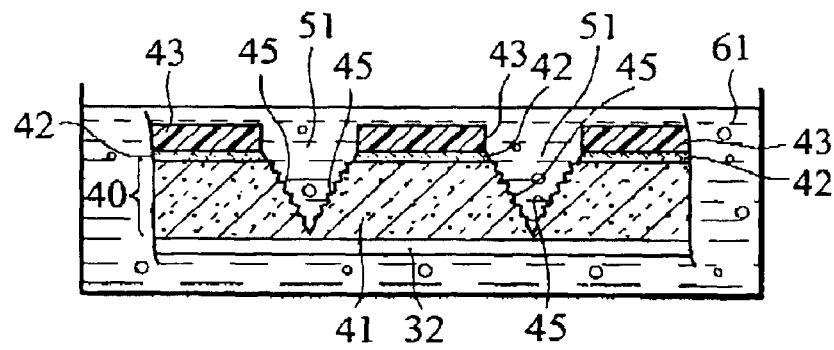

(b) Next as shown in FIG. 10B, by immersing in a HCl—$H_2O_2$ mixed solution 60, damaged layers on the side surface of the first cuts 51, caused by the cutting, is removed and the side surfaces are smoothed. After rinsing with water, as shown in FIG. 10C, the LED wafer 40 is immersed in an HCl solution 61 so that the side surfaces of the first cuts 51 are etched by the HCl solution 61 at 60° C. for 10 minutes. A rough surface 45 is formed on the side surfaces of the first cuts 51.

Figure 10D:
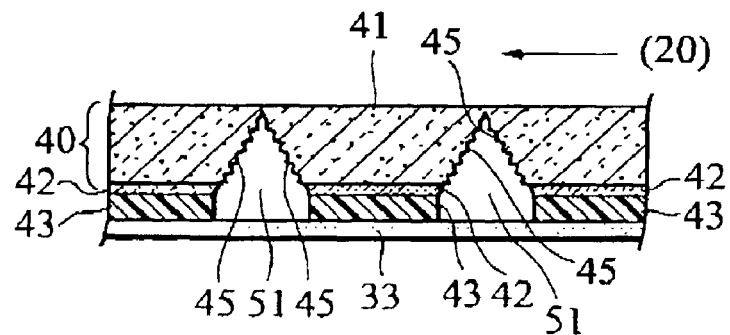

(c) Thereafter, rinsing and drying is performed. The LED wafer 40 is separated from the acid resistant sheet 32, and as shown in FIG. 10D, the LED wafer 40 which was subjected to the rough surface processing on two side surfaces is turned upside down and re-fixed on an acid resistant sheet 33. Then, cutting is performed on a bottom surface in a direction orthogonal to the first cuts 51 in the top surface to form second cuts 52 (see FIG. 4C).

Figure 10E:
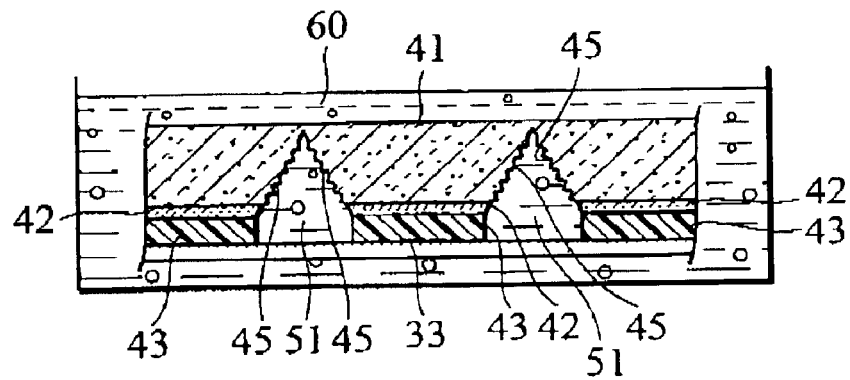
Figure 10F:
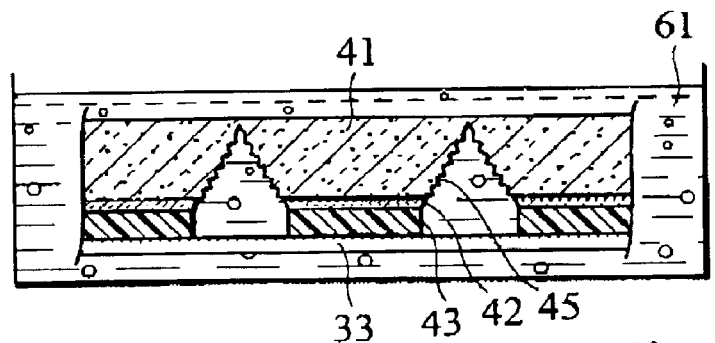

(d) Next, as shown in FIG. 10E, by immersing in the HCl—$H_2O_2$ mixed solution 60, damaged layers on the side surface of the second cuts 52, caused by the cutting, is removed and the side surfaces are smoothed. Thereafter, rinsing and drying is performed, and as shown in FIG. 10F, the LED wafer 40 is immersed in an HCl solution 61 to conduct wet etching under the following conditions of the HCl solution 61: the LED chips 48 are immersed at 60° C. for 10 minutes, and the rough surface 45 is formed on the side surfaces of the second cuts 52.

Figure 10G:
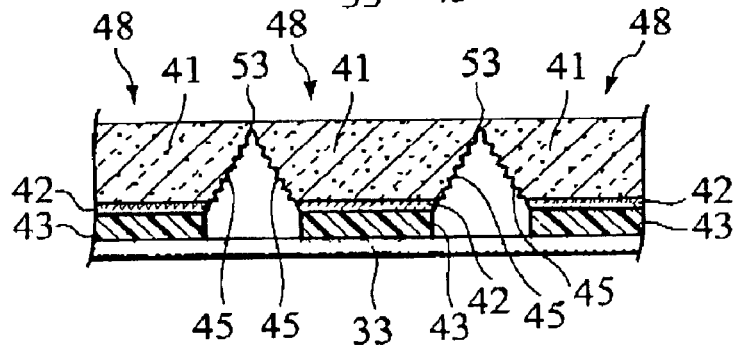
Figure 10H:
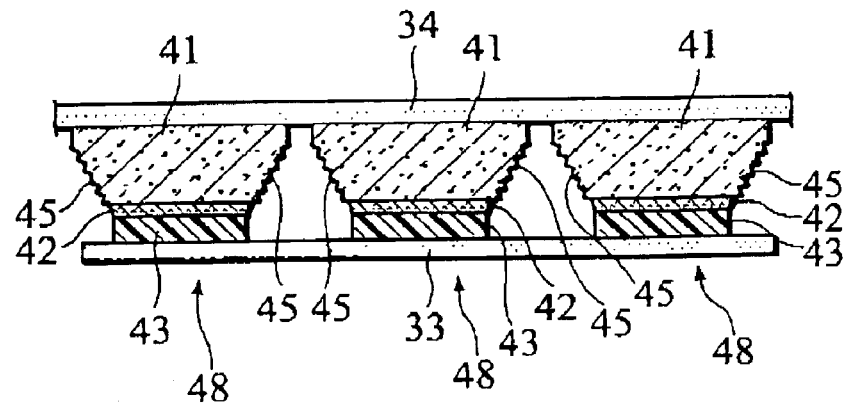

(e) Thereafter, rinsing and drying are performed, and breaking of the LED chips 48 is conducted along cracks 53 generated, as shown in FIG. 10G, to separate the modified pyramid LED chips 48. Then, the acid resistant sheet 33 is expanded, and as shown in FIG. 10H, an acid resistant sheet 34 is further applied opposite the acid resistant sheet 38 to thereby sandwich the modified pyramid LED chips 48 therebetween.

Figure 10I:
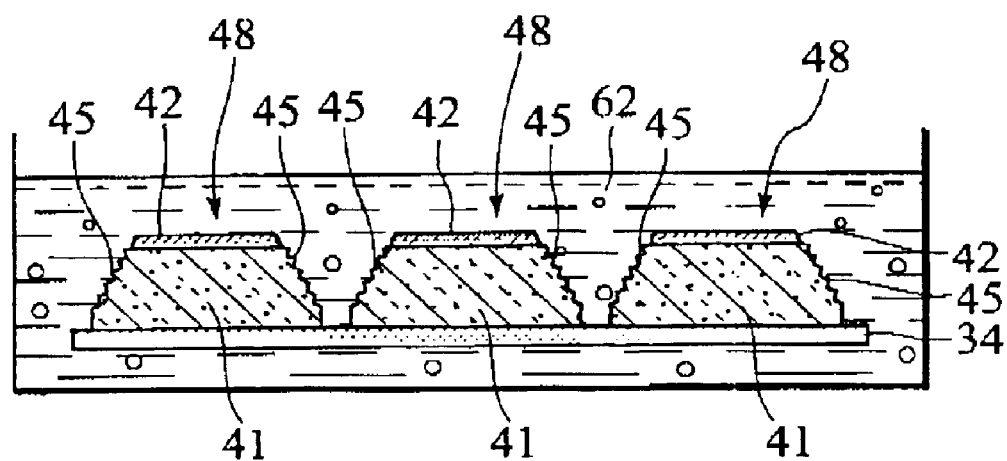
Figure 10J:
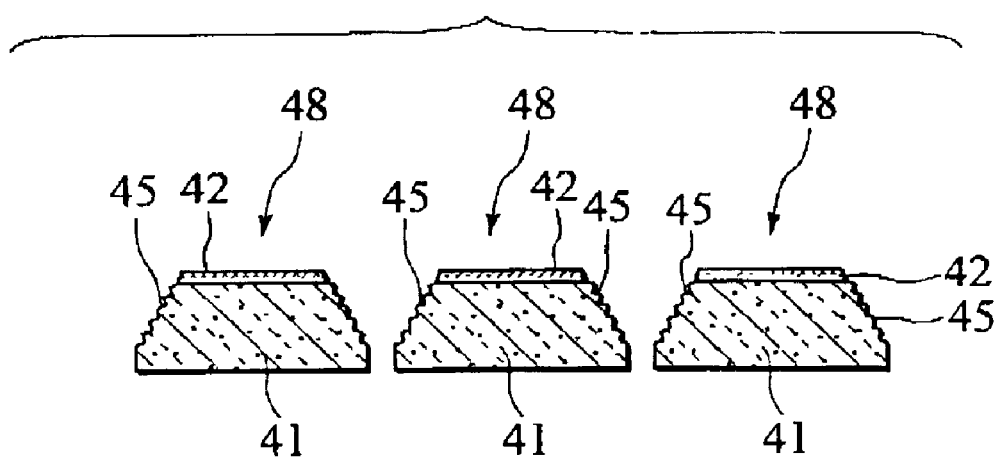

(f) The modified pyramid LED chips 48 are then turned upside down, and the acid resistant sheet 33 is removed. Then, as shown in FIG. 10I, the resist layer 43 is removed by being immersed in a developer 62, and by rinsing with water and drying, the modified pyramid LED chips providing a rough surface all of the side surfaces as shown in FIG. 10J is achieved.

Thus, the modified pyramid LED chip 48 according to the modified example of the first embodiment of the present invention which achieves higher brightness and assures high reliability may be fabricated by a low cost method such as dicing and wet etching.

Second Embodiment

Figure 11:
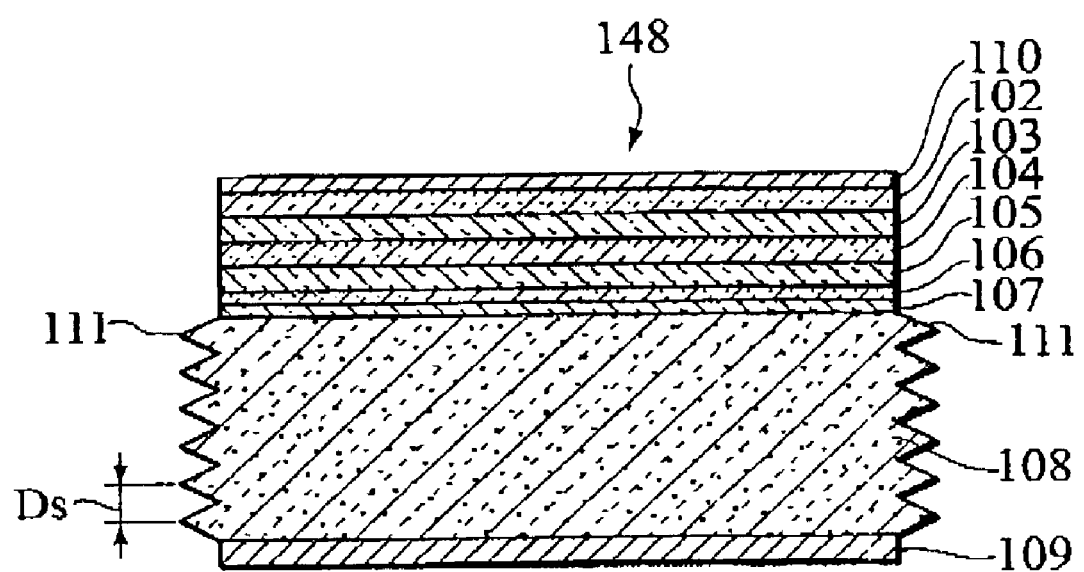
FIG. 11 is a cross-sectional view showing the structure of an LED chip according to a second embodiment of the present invention.

An LED chip 148 according to a second embodiment of the present invention, as shown in FIG. 11, has InGaAlP epitaxial layers including a light emitting layer disposed on a GaP substrate as a base substrate. The base substrate includes the GaP substrate 108 having a p-type conductivity and a p-type GaP layer 107 disposed on the GaP substrate 108. The InGaAlP epitaxial layers includes an n-type current diffusion layer 102, an n-type clad layer 103, an active layer 104, a p-type clad layer 105, and a bonding layer 106. A light emitting layer is the active layer 104 sandwiched between the n-type clad layer 103 and the p-type clad layer 105. The bonding layer 106 of the epitaxial layer is disposed directly on the p-type GaP layer 107 of the base substrate. First and second electrodes 109 and 110 of the LED chip 148 are provided on a bottom surface of the GaP substrate 108 and a top surface of the n-type current diffusion layer 102. The base substrate has rough surface 111 on side surfaces with surface roughness interval Ds.

In the method for manufacturing the LED chip 148 according to the second embodiment of the present invention, an etching solution is used to form the rough surface 111 on the other plane in addition to the {111}P plane described in the first embodiment and the modified example of the first embodiment. Besides the HCl solution, other solutions such as a sulfuric acid-hydrogen peroxide-water ($H_2SO_4$—$H_2O_2$—$H_2O$) solution, an HCl—$H_2O_2$—$H_2SO_4$ solution, a hydrofluoric acid (HF) solution, or a nitric acid ($HNO_3$) solution may be used as the etching solution for the GaP substrate. However, only the HCl solution and the HF solution are able to form the rough surface 111. The HCl solution is able to form the rough surface 111 only on the {111}P plane, however, the HF solution is able to form the rough surface 111 on not only the {111}P plane, but also a {111}Ga plane and {110} plane. None of the etchants are able to form the rough surface 111 on a {100} plane. In the second embodiment of the present invention, a method for forming the rough surface 111 on the side surfaces of the LED chip 148 using the HF solution is described by cross sectional process diagrams shown in FIGS. 12A through 12D.

Figure 12A:
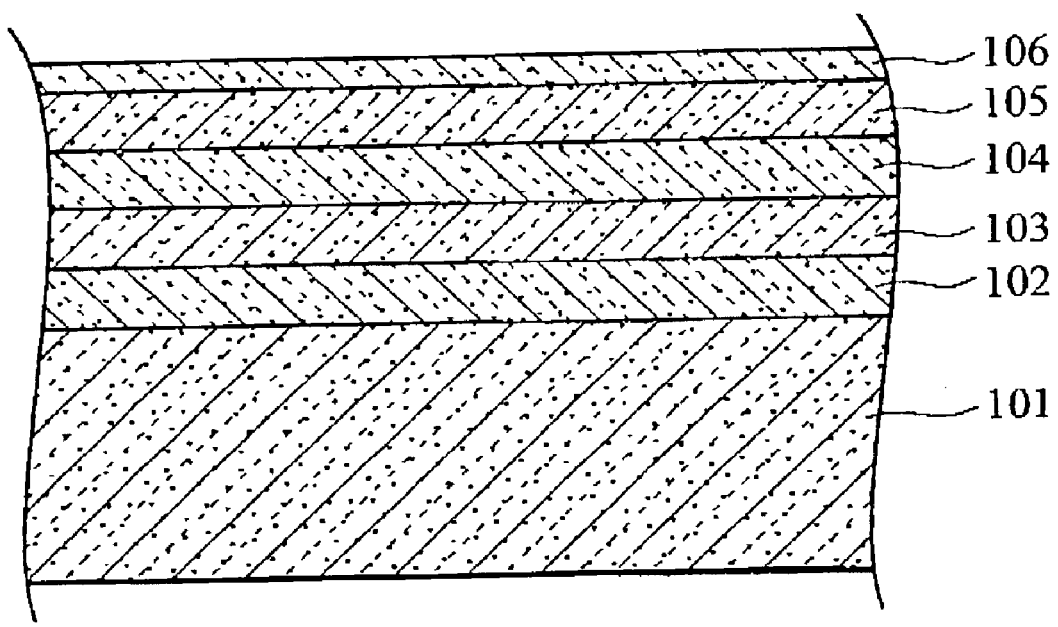
FIGS. 12A through 12D are process diagrams illustrating a method for manufacturing an LED chip according to the second embodiment of the present invention.
Figure 12B:
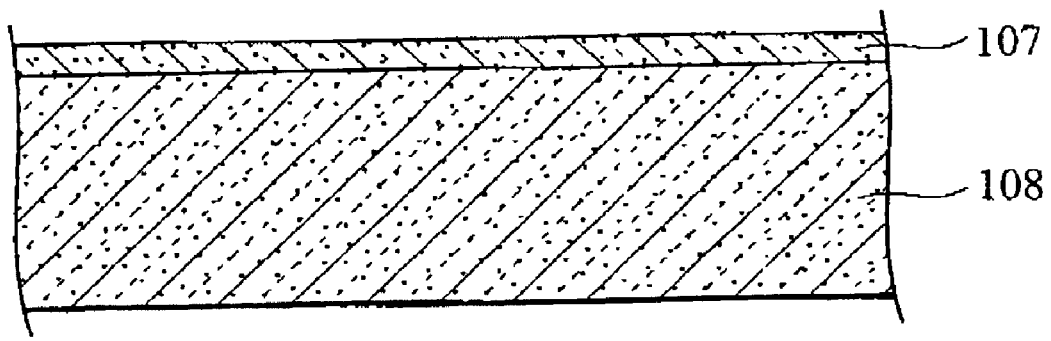

(a) To begin with, as shown in FIG. 12A, an InGaAlP epitaxial wafer is fabricated by growing the n-type current diffusion layer 102, the n-type clad layer 103, the active layer 104, the p-type clad layer 105, and the bonding layer 106, sequentially upon an n-type GaAs substrate 101. In addition, as shown in FIG. 12B, the base substrate is prepared by growing the p-type GaP layer 107 with a high concentration of approximately $1*10^{18}$ cm$^{-3}$ on the GaP substrate 108.

Figure 12C:
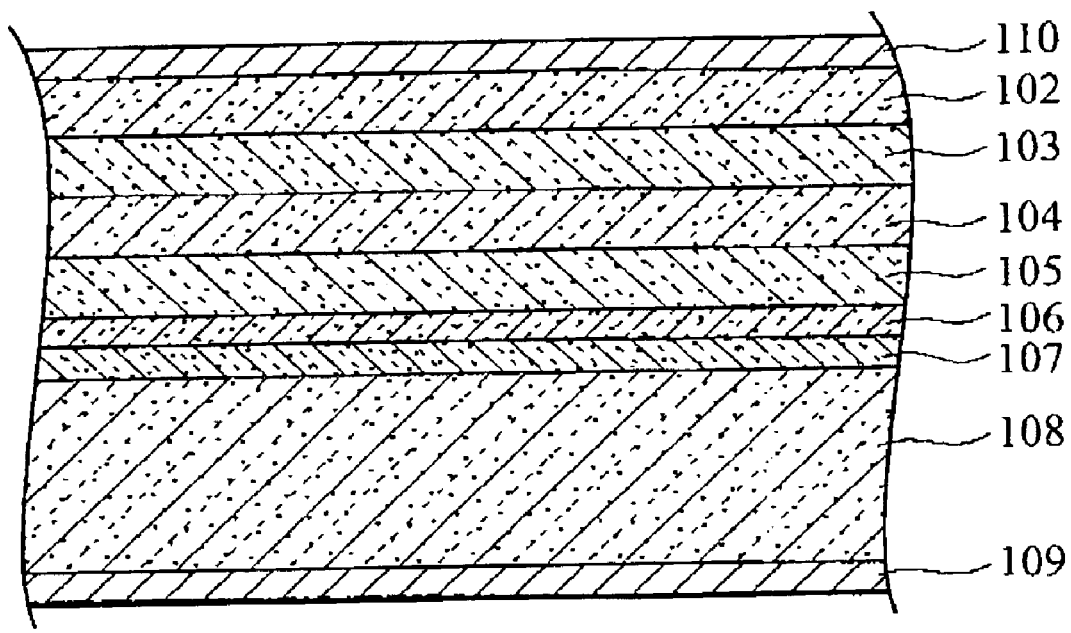
Figure 12D:
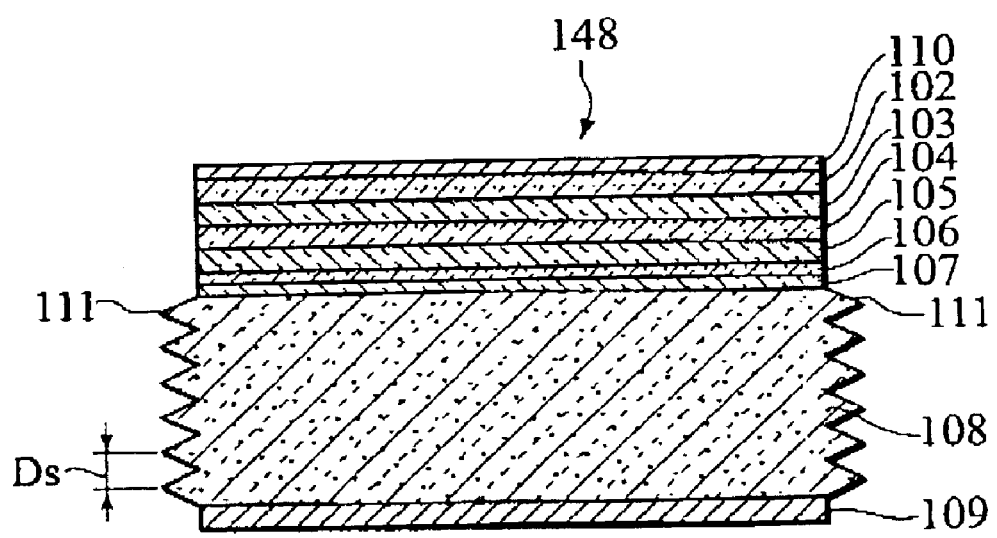

(b) A surface of the bonding layer 106 of the InGaAlP epitaxial wafer is directly bonded onto a surface of the p-type GaP layer 107 of the base substrate. Then, the n-type GaAs substrate 101 in the InGaAlP epitaxial wafer is removed using polishing, etching or the like to expose the top surface of the n-type current diffusion layer 102. In addition, as shown in FIG. 12C, on the bottom surface of the GaP substrate 108 and on the top surface of the n-type current diffusion layer 102, respective first and second electrodes 109 and 110 are deposited using, for example, a vacuum vapor deposition or the like.

(c) Next, the LED chips 148 are separated using a process such as scribing, dicing or the like. With the LED chip 148 according to the second embodiment of the present invention, separation is performed vertically along the {110} plane, which is a direction of cleavage, to form a rectangular solid shape. For example, the bottom surface of the GaP substrate 108 is mounted on a scribing sheet, and then, the separation is performed by scribing. After scribing, an adhesive sheet is applied to the top surface of the n-type current diffusion layer 102. Next, the scribing sheet is removed from the bottom surface. The adhesive sheet is then expanded to separate the LED chips 148. Then, the LED chips 148 are directly immersed in the RF solution and, as shown in FIG. 10D, the rough surface 111 is formed on the side surfaces of the LED chips 148. Concentration of the HF solution may be, for example, 49% and etching may last 20 minutes. However, the etching conditions may naturally be duly selected as required. With immersion in the HF solution, all of the side surfaces of the LED chips 148 are provided the rough surface 111 with surface roughness interval Ds ranging between about 1 and 5 μm. Following the rough surface formation using the HF solution, the LED chips 148 are rinsed in running water for 15 minutes, dried, and assembled into LED lamps.

Figure 13:
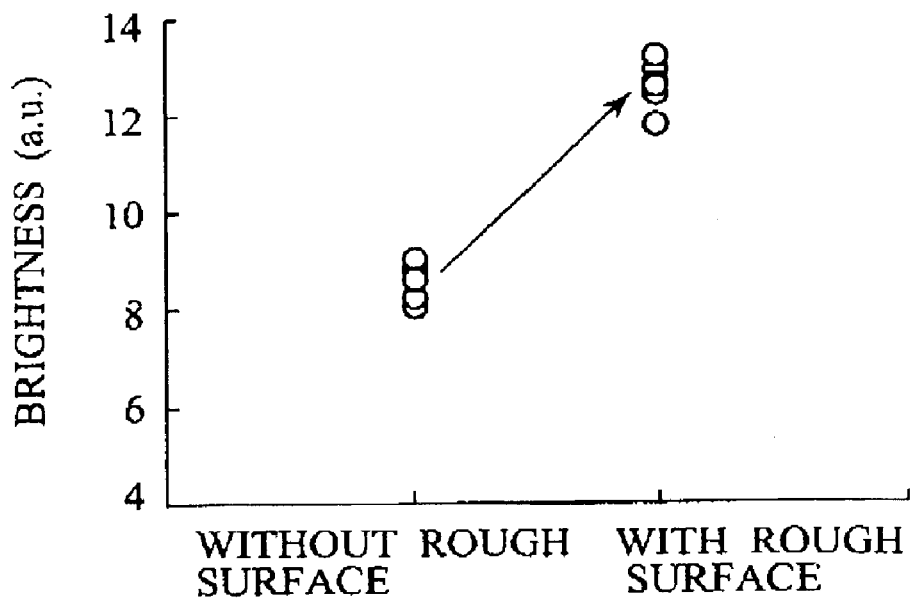
FIG. 13 is a graph showing brightness measurement results for the LED chips with or without rough surface.

In comparison with LED lamps without rough surface, as shown in FIG. 13, an approximately 47% improvement in brightness is verified for the LED lamps using the LED chips 148 with the rough surface 111 formed on all of the side surfaces by immersing in the HF solution.

In the LED chip 148 according to the second embodiment of the present invention, a wafer with a top surface having a crystal orientation of (100) plane or tilted from the (100) plane in a range of between about 0.5 and 20 degrees, optimally in a range between about 5 and 15 degrees, is used for the GaP substrate 108. It is better that there is no rough surface formed on the bottom surface of the GaP substrate 108 on which an LED electrode 109 is formed. During the rough surface processing using the HF solution, the rough surface is not formed on the (100) plane or the tilted plane from the (100) plane within 20 degrees.

In the case of the rectangular solid LED chip, with a structure where a (100) plane is arranged at a side surface, two surfaces of the four side surfaces become (100) planes on which the rough surface cannot be formed, and the remaining two surfaces become (110) planes on which the rough surface may be formed. Accordingly, the extraction efficiency for the two side surfaces of the (110) plane on which the rough surface is formed becomes significantly brighter, meanwhile the extraction efficiency for the two side surfaces of the (100) plane decreases and the two side surfaces become darker. A luminous intensity distribution characteristic, which is one of the important characteristics of the LED lamp, may be decreased. Accordingly, with the LED chip having the rough surface with the HF solution, care is taken to prevent the (100) plane from appearing at side surfaces. In the second embodiment of the present invention, the (100) plane is used as the electrode surface to prevent affecting the luminous intensity distribution characteristic. Thus, when the (100) plane is applied for the surface forming the electrode, then a high brightness LED lamp having a superior luminous intensity distribution characteristics may be achieved since all of the side surfaces of the LED chip with the rectangular solid shape become crystal planes other than the (100) plane, for example, the (110) plane.

Figure 14:
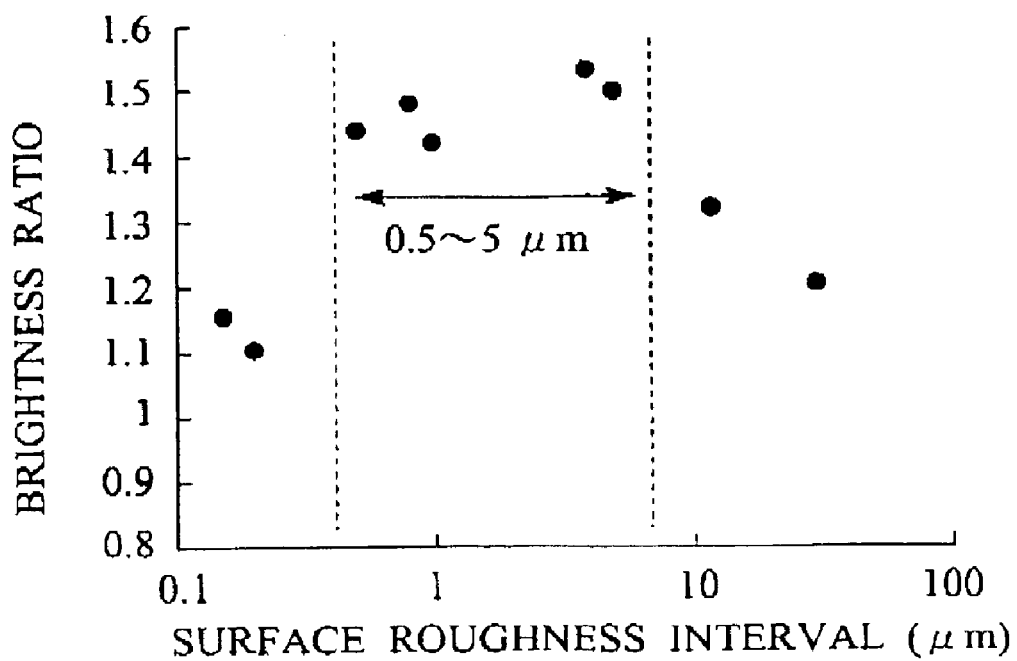
FIG. 14 is a graph showing the relationship between the surface roughness interval and brightness for the LED chips.

The surface roughness interval Ds obtained by immersing in the HF solution depends greatly on the etching time and the crystal orientation. In particular, a longer etching time tends to give larger surface roughness intervals. A brightness improvement effect in the LED lamps with the rectangular solid LED chips 148 with the rough surface, as shown in FIG. 14, are approximately 1.5 times better in comparison with LED lamps without the rough surface, when the surface roughness interval Ds ranges between about 0.5 and 5 μm.

With the method for manufacturing an LED according to the second embodiment of the present invention, it is possible to achieve a rectangular solid LED chip having high reliability, higher brightness, and superior luminous intensity distribution characteristics.

Other Embodiments

The present invention has been described as mentioned above, however the descriptions and drawings that constitute a portion of this disclosure should not be perceived as limiting this invention. Various alternative embodiments and operational techniques will become clear to persons skilled in the art from this disclosure.

With the LED according to the first embodiment and the modified example of the first embodiment of the present invention, a modified pyramid shape is formed using a GaP substrate, however, this is not limited to LED wafers using a GaP substrate, but may naturally be applied to various LEDs using substrates that are substantially transparent for the wavelength of the emitted light, for example an LED using a sapphire substrate, GaAs substrate, or InP substrate. In addition, the structure according to the first embodiment and the modified example of the first embodiment of the present invention allows various shapes to be formed using various combinations of uncut thickness, sidewall angle, wafer thickness, dicing pitch and the like, having extremely large versatility, and any number of variations based upon this structure may be applied. In addition, depending on the type of wafer and crystal orientation, methods for forming the shape according to the first and second embodiments of the present invention is not limited to dicing or scribing, but may naturally also include technology such as wire saws, polishing, or cleavage. Furthermore, in accordance with the present invention, it is naturally not limited to the (100) wafer but may also be applicable to a wafer that is an arbitrary tilted angle off from (100).

Various modifications will become possible for those skilled in the art after receiving the teachings of the present disclosure without departing from the scope thereof.

What is claimed is:

1. A light emitting element, comprising:

a light emitting layer;

a rectangular first principal surface being parallel to the light emitting layer, a crystal orientation of the first principal surface being in a range of between a (100) plane and approximately 20 degrees from the (100) plane;

a rectangular second principal surface opposing to the first principal surface so that the light emitting layer is sandwiched between the first and second principal surfaces, a crystal orientation of the second principal surface being in a range of between a (100) plane and approximately 20 degrees from the (100) plane; and first through fourth side surfaces of the light emitting element provided with a rough surface, the first through fourth side surfaces connecting between the first principal surface and the second principal surface, respectively so as to define a solid shape.

2. A light emitting element comprising:

a light emitting layer;

a rectangular first principal surface being parallel to the light emitting layer;

a rectangular second principal surface opposing to the first principal surface so that the light emitting layer is sandwiched between the first and second principal surfaces; and first through fourth side surfaces of the light emitting element providing with a rough surface, the first through fourth side surfaces connecting between the first principal surface and the second principal surface, respectively to define a solid shape.

wherein the first and second side surfaces are disposed opposite each other and between the first and second principal surfaces and having a trapezoid shape for a cross section orthogonal to a set of opposite edges of the first principal surface, and the third and fourth side surfaces are disposed opposite each other and between the first and second principal surfaces and having an inverse-trapezoid shape for a cross section orthogonal to another set of opposite edges of the first principal surface.

3. A light emitting element comprising:

a light emitting layer;

a rectangular first principal surface being parallel to the light emitting layer;

a rectangular second principal surface opposing to the first principal surface so that the light emitting layer is sandwiched between the first and second principal surfaces; and first through fourth side surfaces of the light emitting element provided with a rough surface, the first through fourth side surfaces connecting between the first principal surface and the second principal surface, respectively to define a solid shape.

wherein the first and second side surfaces of the light emitting element are configured to have a stress applied thereto and induced in a direction, extending from a set of opposite edges of the first principal surface to a corresponding set of opposite edges of the second principal surface, and the third and fourth side surfaces of the light emitting element are configured to have another stress applied thereto and induced in a reverse direction to the stress, extending from another set of opposite edges of the first principal surface to a corresponding set of opposite edges of the second principal surface.

4. The light emitting element of claim 1, wherein a surface roughness interval is in a range of between approximately 0.5 and 5 $\mu$m.

5. The light emitting element of claim 2, wherein respective angles between the first principal surface and the first or second side surface, and between the second principal surface and the third or fourth side surface is in a range of between approximately 20 and 40 degrees.

6. The light emitting element of claim 2, wherein crystal orientations of the first and second principal surfaces are in a range of between a (100) plane and approximately 20 degrees from the (100) plane.

7. The light emitting element of claim 2, wherein a surface roughness interval is in a range of between approximately 0.5 and 5 $\mu$m.

8. The light emitting element of claim 3, wherein respective angles between the first principal surface and the first or second side surface, and between the second principal surface and the third or fourth side surface is in a range of between approximately 20 and 40 degrees.

9. The light emitting element of claim 3, wherein crystal orientations of the first and second principal surfaces are in a range of between a (100) plane and approximately 20 degrees from the (100) plane.

10. The light emitting element of claim 3, wherein a surface roughness interval is in a range of between approximately 0.5 and 5 $\mu$m.

* * * * *